United States Patent
Nopper et al.

(10) Patent No.: US 7,560,381 B2
(45) Date of Patent: Jul. 14, 2009

(54) TECHNIQUE FOR METAL DEPOSITION BY ELECTROLESS PLATING USING AN ACTIVATION SCHEME INCLUDING A SUBSTRATE HEATING PROCESS

(75) Inventors: Markus Nopper, Dresden (DE); Axel Preusse, Radebeul (DE); Matthias Bonkass, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 563 days.

(21) Appl. No.: 11/211,786

(22) Filed: Aug. 25, 2005

(65) Prior Publication Data

US 2006/0194431 A1    Aug. 31, 2006

(30) Foreign Application Priority Data

Feb. 28, 2005    (DE)    ........................ 10 2005 009 072

(51) Int. Cl.
*H01L 21/00* (2006.01)
(52) U.S. Cl. .................. 438/652; 438/678; 438/687
(58) Field of Classification Search ................ 438/652, 438/678, 687
See application file for complete search history.

(56) References Cited

U.S. PATENT DOCUMENTS

| | | | | |
|---|---|---|---|---|
| 5,358,885 A | * | 10/1994 | Oku et al. .................. 438/571 |
| 6,040,239 A | * | 3/2000 | Akram et al. ............... 438/612 |
| 6,897,152 B2 | * | 5/2005 | Verbunt ...................... 438/687 |
| 2002/0086102 A1 | * | 7/2002 | Grunwald ..................... 427/98 |
| 2004/0154929 A1 | * | 8/2004 | Grunwald .................... 205/291 |
| 2005/0282384 A1 | * | 12/2005 | Nawafune et al. ........... 438/678 |
| 2006/0110847 A1 | * | 5/2006 | Fujimori et al. ............... 438/99 |
| 2006/0194431 A1 | * | 8/2006 | Nopper et al. .............. 438/652 |
| 2008/0001236 A1 | * | 1/2008 | Change ...................... 257/401 |

FOREIGN PATENT DOCUMENTS

| | | |
|---|---|---|
| DE | 1579 89 | 10/1980 |
| DE | 249 495 A1 | 2/1986 |
| DE | 102 45 928 A1 | 4/2004 |

OTHER PUBLICATIONS

Jun. 26, 2008 letter from foreign associate.

* cited by examiner

*Primary Examiner*—Laura M Menz
(74) *Attorney, Agent, or Firm*—Williams, Morgan & Amerson

(57) ABSTRACT

In an enhanced technique for electroless metal deposition, the substrate is heated to or above the operating temperature for the specific plating solution, while the plating solution may be maintained at a non-critical low temperature to substantially prevent spontaneous self-decomposition within the plating tool. Hence, significant advantages with respect to process control and cost of ownership may be achieved.

15 Claims, 3 Drawing Sheets

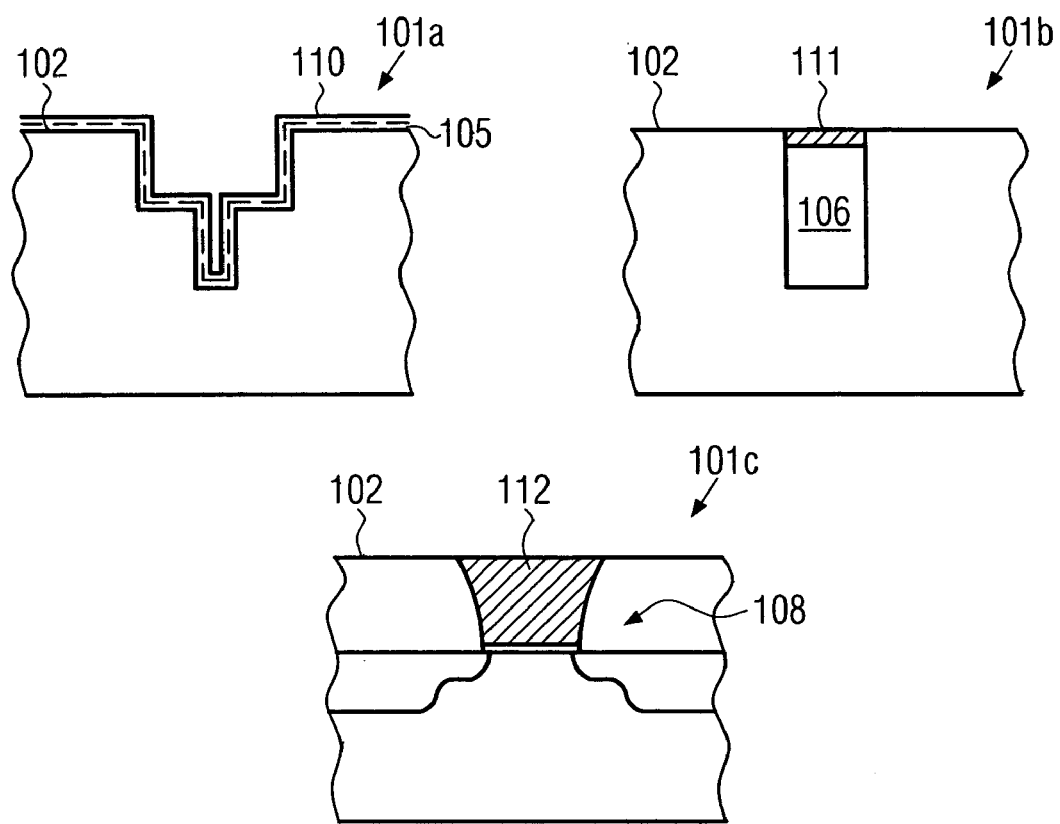
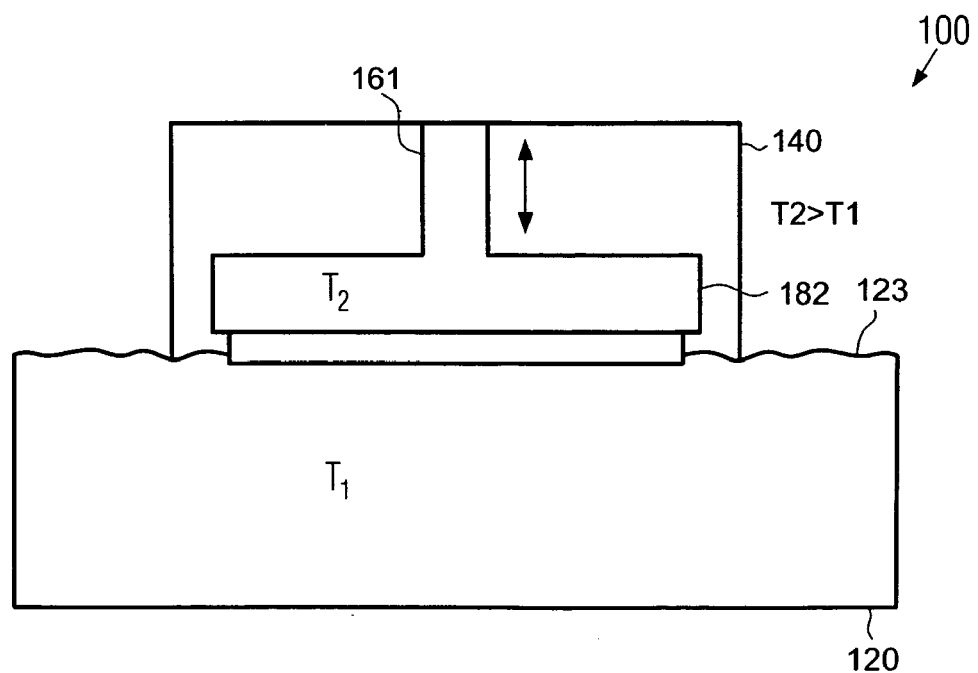
FIG. 1c
FIG. 1d

TECHNIQUE FOR METAL DEPOSITION BY ELECTROLESS PLATING USING AN ACTIVATION SCHEME INCLUDING A SUBSTRATE HEATING PROCESS

BACKGROUND OF THE INVENTION

1. Field of the Invention

The present invention generally relates to the field of fabrication of microstructures, such as integrated circuits, and more particularly relates to the formation of metal layers over a dielectric that may contain trenches and vias by a deposition process including an electroless plating process.

2. Description of the Related Art

In a microstructure, such as an integrated circuit, a huge number of structure elements, such as transistors, capacitors, resistors and the like, are formed in or on an appropriate substrate. In many cases, the microstructures include complex circuitry, in which, due to the large number of structure elements and the complex layout of the circuitry, the electrical connection of the individual circuit elements may not be established within the same level on which the circuit elements are manufactured, but requires one or more additional "wiring" layers, also referred to as metallization layers. These metallization layers generally include metal lines, providing the inner-level electrical connection, and also include a plurality of inter-level connections, also referred to as vias, wherein the metal lines and vias may also be commonly referred to as interconnects.

Due to the continuous shrinkage of the feature sizes of circuit elements in modern integrated circuits, the number of circuit elements for a given chip area, that is the package density, also increases, thereby typically requiring an even larger increase in the number of electrical interconnections to provide the desired circuit functionality. Therefore, the number of stacked metallization layers may increase as the number of circuit elements per chip area becomes larger and/or the corresponding interconnect structures also need to be reduced. Since the fabrication of a plurality of metallization layers entails extremely challenging issues to be solved, such as mechanical, thermal and electrical reliability, in combination with an efficient deposition technique to provide high throughput, for sophisticated applications, such as microprocessors, semiconductor manufacturers are increasingly replacing the well-known metallization metal aluminum by a metal that allows higher current densities and hence allows a reduction in the dimensions of the interconnections. For example, copper and alloys thereof are metals generally considered to be viable candidates for replacing aluminum due to superior characteristics in view of higher resistance against electromigration and significantly lower electrical resistivity when compared with aluminum.

In spite of these advantages, copper also exhibits a number of disadvantages regarding the processing and handling of copper in a semiconductor facility. For instance, copper may not be efficiently applied onto a substrate in larger amounts by well-established deposition methods, such as chemical vapor deposition (CVD) and physical vapor deposition (PVD), and also may not be effectively patterned by the usually employed anisotropic etch procedures, due to copper's characteristics to form non-volatile reaction products. In manufacturing metallization layers including copper, the so-called damascene technique is therefore preferably used, wherein a dielectric layer is first applied and then patterned to define trenches and vias, which are subsequently filled with copper.

A further major drawback of copper is its propensity to readily diffuse in silicon dioxide and other dielectric materials. It is therefore necessary to employ a so-called barrier material in combination with a copper-based metallization to substantially avoid any out-diffusion of copper into the surrounding dielectric material, as copper may then readily migrate to sensitive semiconductor areas, thereby significantly changing the characteristics thereof. Since the dimensions of the trenches and vias are currently approaching a width or a diameter of approximately 0.1 µm and even less with an aspect ratio of the vias of about 5 or more, the deposition of a barrier layer reliably on all surfaces of the vias and trenches and subsequent filling thereof with copper substantially without voids is one of the most challenging issues in the fabrication of modern integrated circuits.

Currently, the formation of a copper-based metallization layer is performed by patterning an appropriate dielectric layer and depositing the barrier layer, for example comprised of tantalum and/or tantalum nitride, by advanced PVD techniques, such as sputter deposition. Thereafter, the copper is filled in the vias and trenches, wherein electroplating has proven to be a viable process technique, since it is capable of filling the vias and trenches with a high deposition rate, compared to CVD and PVD rates, in a so-called bottom-up regime, in which the openings are filled starting at the bottom in a substantially void-free manner. Generally, during electroplating a metal onto a surface, an external electric field has to be applied between the surface to be plated and the plating solution. Since substrates for semiconductor production may only be contacted at restricted areas, usually at the perimeter of the substrate, a conductive layer covering the substrate and the surfaces that are to receive a metal has to be provided. Although the barrier layer previously deposited over the patterned dielectric may act as a current distribution layer, it turns out, however, that in view of crystallinity, uniformity and adhesion characteristics, presently a so-called seed layer is preferably used in the subsequent electroplating process to obtain copper-filled trenches and vias having the required electrical and mechanical properties. The seed layer is typically applied by sputter deposition using substantially the same process tools as are employed for the deposition of the barrier layer.

For vias having critical dimensions of 0.1 µm and less in future device generations, the sputter deposition of extremely thin metal layers having a high degree of conformity as required for the barrier layer and the seed layer may become a limiting factor, since the coverage characteristics of the above-described advanced sputter tools may not be further enhanced without significant modifications of these tools, which may be difficult to accomplish. Especially the deposition of the seed layer may not be performed in a straightforward manner by PVD, as here the uniformity of the seed layer, contrary to the barrier layer which "only" requires a sufficient and complete coverage of the inner surfaces of the openings, determines to a certain degree the uniformity of the following electroplating process. Moreover, PVD techniques producing extremely thin layers appropriate for barrier layers may result, when applied to the formation of seed layers, in an increased electric resistance, thereby reducing an initial deposition rate of the subsequent electroplating process.

As a consequence, alternative deposition techniques for highly sophisticated applications have been proposed for barrier deposition, seed deposition, metal cap deposition on copper-based lines and metal gate deposition. The electroless deposition of metals and alloys, known for instance in the printed wire board industry, represents a promising approach as an alternative or an extension to well-established electroplating strategies. The process of electroless deposition requires a plating solution including a reducing agent, a metal carrier and a complexing agent with a precise control, in addition to the control of the bath composition, of the pH value and the temperature, as an active initiation of a chemical reaction of the plating agents by means of a catalyst contained in the underlying material or deposited prior to the actual deposition process is highly sensitive to the process temperature.

Typically, the operating temperature of the electroless metal plating solution may be in the range of approximately 50-90° C., which means that the electroless plating solution is maintained very closely to the self-catalyzing temperature for spontaneous self-decomposition of the electroless plating solution. The occurrence of a self-catalyzed decomposition of the electroless plating solution, however, results in metal plating not only on desired areas, that is the substrate surface to be plated, but also on surfaces of the plating equipment, such as the reactor cell, the plating solution tank, supply lines and the like. In severe cases of self-catalyzed decomposition, substantially the entire metal contents in the plating solution is rapidly reduced to pure metal, thereby possibly causing clogging of all lines and tubings and the chemical reactor. As a consequence, great efforts have to be made in cleaning the plating equipment with nitric acid while additionally the complete expensive plating chemistry is lost. At the same time, the resulting toxic waste has to be disposed, thereby significantly contributing to cost of ownership of the electroless metal plating process.

In view of the situation described above, there exists a need for an enhanced technique that avoids or at least reduces the effects of at least some of the problems in the electroless plating of metal as described above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that significantly reduces the risk of self-catalyzed decomposition of an electroless metal plating solution, while at the same time the efficiency of the electroless plating process may be enhanced. For this purpose, the substrate surface to be plated is heated while, in illustrative embodiments, the electroless plating solution may be maintained at a non-critical temperature with respect to self-catalyzed spontaneous decomposition, thereby accomplishing a highly efficient plating process, since the operating temperature for the plating process is applied substantially at those regions at which metal deposition is desired while the spontaneous deposition of metal within the plating equipment may significantly be reduced.

According to an illustrative embodiment of the present invention, a method comprises heating a substrate surface at least to an operating temperature of an electroless metal plating solution and contacting the substrate surface with the electroless metal plating solution to deposit a metal on the substrate surface.

According to a further illustrative embodiment of the present invention, a system comprises a storage tank that is configured to contain an electroless metal plating solution at a temperature below an operating temperature of the electroless metal plating solution. Moreover, the system comprises a process chamber configured to receive and hold a substrate having a process surface. Furthermore, a supply system is provided and configured to supply electroless metal plating solution to the process surface. Finally, the system comprises a heating unit coupled to the process chamber and configured to heat a temperature of the process surface at least up to the operating temperature.

BRIEF DESCRIPTION OF THE DRAWINGS

The invention may be understood by reference to the following description taken in conjunction with the accompanying drawings, in which like reference numerals identify like elements, and in which:

FIG. 1c schematically depicts cross-sectional views of the substrate surfaces of FIG. 1b after the metal deposition by electroless plating in accordance with illustrative embodiments of the present invention;

FIG. 1d schematically illustrates a process chamber in which the substrate is brought into contact with the electroless plating solution, wherein the substrate temperature is at the operating temperature, while the bath temperature is less than the operating temperature, in accordance with an illustrative embodiment.

Figure 1A:
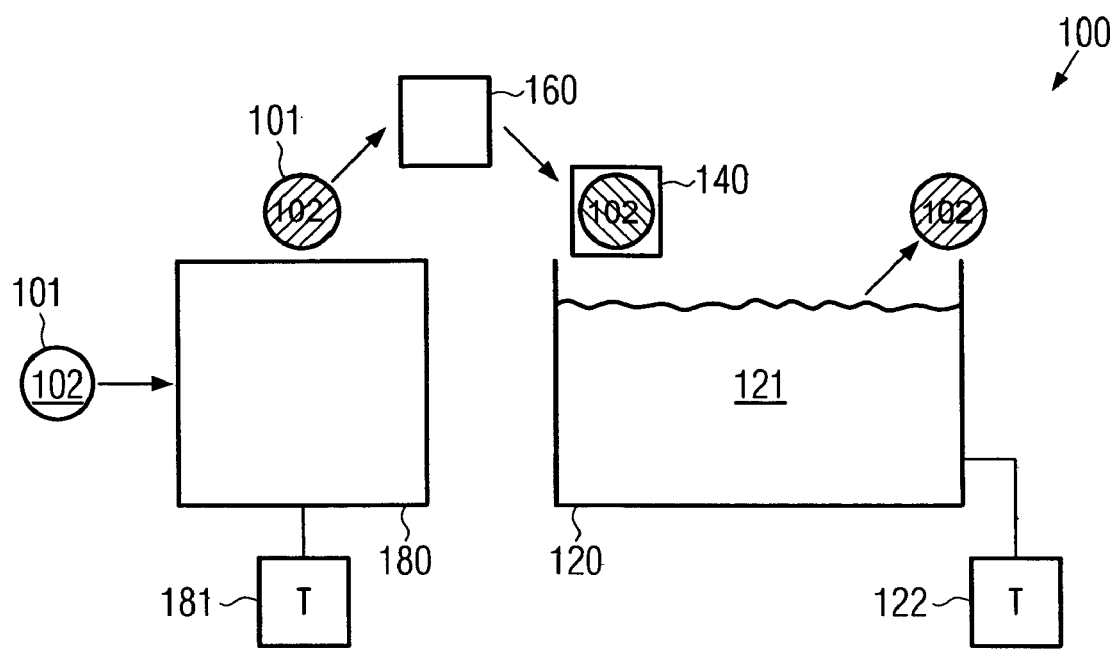
FIG. 1a schematically shows a system for electroless metal plating, in which a substrate surface is heated at least up to an operating temperature of the metal plating solution in accordance with illustrative embodiments of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention provides a technique for electroless metal plating, in which at least the substrate surface to be plated is heated up to at least the operating temperature for an electroless plating solution, thereby providing the potential for maintaining the bulk of the plating solution at a non-critical temperature with respect to the point of self-catalyzed spontaneous self-decomposition of the plating solution. Thus, by heating the substrate up to the operating temperature instead of the electroplating solution, the operating temperature for the plating solution is produced in a highly localized manner, thereby significantly reducing a deposition rate of the plating solution at non-desired locations, such as process chamber walls, supply lines, storage tank surfaces and the like. Therefore, maintenance of the plating equipment is significantly relaxed, thereby reducing cost of ownership for the electroless plating. Moreover, the potential for maintaining the electroless plating solution at a substantially non-critical temperature may significantly prolong the lifetime of the plating bath while at the same time the requirements for filtering and recirculating the solution may be reduced, since the probability of self-decomposition during passing through filtering means and recirculation equipment is significantly lowered. Thus, the overall process control for the electroless plating process is simplified and hence any process control resources conventionally used for reducing spontaneous decomposition may be assigned to procedures for superior process control in view of process uniformity, defect rate and the like.

With reference to the accompanying drawings further illustrative embodiments of the present invention will now be described in more detail. FIG. 1a schematically shows a plating system 100 for depositing a metal onto a substrate surface 102 of a substrate 101 in accordance with illustrative embodiments of the present invention. The system 100 comprises a storage tank 120 including a plating solution 121, which may in turn comprise a metal carrier, a reducing agent and a complexing agent. The plating solution 121 may comprise certain amounts of other additives that may be required for the process under consideration. For instance, the plating solution 121 may represent a solution on the basis of copper, EDTA, NaOH and HCHO, or copper, KNa tartrate, NAOH, HCHO may be used when a copper layer is to be deposited on the substrate surface 102. For depositing other metals or metal alloys, respective appropriate plating solutions 121 may be used as are known from conventional processes or as may be developed in accordance with process requirements. In some embodiments of the present invention, the plating solution 121 may be appropriate for forming a barrier layer and/or a seed layer and/or a capping layer for previously deposited metal regions and/or metal gates, as will be described in more detail with reference to FIGS. 1b and 1c.

The storage tank 120 is further configured to receive and contain the plating solution 121 therein at predefined conditions with respect to the pH value, the temperature, the material composition, contaminating particles, air bubbles and the like. Hence, the storage tank 120 may be connected to a storage control unit 122, which is configured to control at least some of the above-identified parameters and especially to maintain the temperature of the plating solution 121 at a specified temperature that is lower than an operating temperature required for reliably and reproducibly depositing metal on the substrate surface 102. For convenience, any means for obtaining measurement values with respect to the parameters to be controlled, as well as any means for operating on the plating solution 121 so as to establish a desired condition, such as heating segments, feed lines for the various bath ingredients, recirculation means, filtering means and the like, are not shown as such items are well known to those skilled in the art. The storage tank 120 is further operatively connected to a supply system 160, which in turn is operatively coupled to a process chamber 140. The supply system 160 is configured to bring into contact at least a portion of the plating solution 121 with the substrate surface 102, wherein the supply system 160 is to represent any mechanism to provide plating solution 121 onto the substrate surface 102 within the process chamber 140. For instance, the supply system 160 may comprise appropriate conveying units for receiving the substrate 101 and bringing the substrate surface 102 into contact with the liquid surface of the solution 121 within the process chamber 140 in a bath-type plating reactor. In a fountain-type plating reactor, the supply system 160 may represent the drive assembly for contacting the liquid surface of the plating solution and for establishing a required electrolyte flow within the process chamber 140. In other cases, the supply system 160 may represent a supply line and any appropriate applicator mechanism for conveying plating solution from the storage tank 120 into the process chamber 140 and on the substrate surface 102, as is typically performed in fountain-type plating reactors, when only a well-defined amount of plating solution is supplied to the process chamber 140 to provide highly stable deposition conditions. It should be appreciated that, however, any other type of plating reactor may be used with the present invention.

The system 100 further comprises a heating unit 180 that is configured to receive the substrate 101 and raise the temperature thereof, or at least the surface temperature of the substrate surface 102, up to a specified operating temperature that is required for initiating the decomposition of the plating solution 121 and thus the deposition of metal on the substrate surface 102. The operating temperature may be selected between approximately 50-100° C. for copper deposition, but may be appropriately selected when other materials are to be deposited. Moreover, the operating temperature, even though various temperatures may be chosen for a metal under consideration, significantly affects the deposition rate and the deposition result and therefore, for a given recipe, the operating temperature represents a well-defined process parameter, whose value is to be kept constant within a predefined process window.

The heating unit 180 is operatively coupled to the supply system 160 and thus to the process chamber 140. It should be noted that the heating unit 180 may be configured in any appropriate manner as long as it may heat up the substrate surface 102 prior to supplying the substrate 101 to the process chamber 140, and/or during the supply of the substrate 101 to the process chamber 140, and/or after having supplied the substrate 101 to the process chamber 140. Thus, the heating unit 180 may comprise one or more appropriate heating units, such as radiating heating units and/or heated substrate chucks and/or heating fluids, as will be described in more detail with reference to FIGS. 1e-1f. In one illustrative embodiment, the heating unit 180 comprises a temperature controller 181 that is configured to at least detect a measured temperature of the substrate surface 102 or any other substrate temperature related thereto and to produce a signal that is indicative of the surface temperature. For instance, the temperature controller 181 may comprise an infrared measurement system to determine the surface temperature in a non-contacting manner. In other embodiments, any other appropriate temperature measurement system may be incorporated that may determine the momentary temperature by direct contact with the substrate 101 and/or with a fluid contacting the substrate 101. In further illustrative embodiments, the temperature controller 181 is further configured to control the operation of the heating unit 180, that is, at least the function of any heating units of the heating unit 180, on the basis of the signal provided by the temperature controller 181. In this embodiment, a certain temperature may be specified in advance that is at or above the desired operating temperature for the plating process recipe under consideration and the temperature controller 181 may perform a control operation on the basis of the target value and the momentary temperature to minimize a difference between these two values. For this purpose, any well-known control schemes, such as PID control strategies (proportional, integral, differential), or any other algorithms may be used.

During the operation of the system 100, the substrate 101, which may represent a carrier for microstructures, such as integrated circuits and the like, is provided wherein the substrate surface 102, on which is to be deposited a specified metal, may have a specified topography, depending on the type of substrate. While the system 100 may be used for highly efficiently depositing a metal or metal alloy onto the substrate surface 102, when representing a substantially planar surface, the system 100 may be used in a highly advantageous manner for depositing a specified metal onto the substrate surface 102 when comprising a plurality of structural elements, such as trenches, vias and the like. Hereby, the deposition of a metal or metal alloy may be performed in a highly localized manner, depending on the specific process strategy.

Figure 1B:
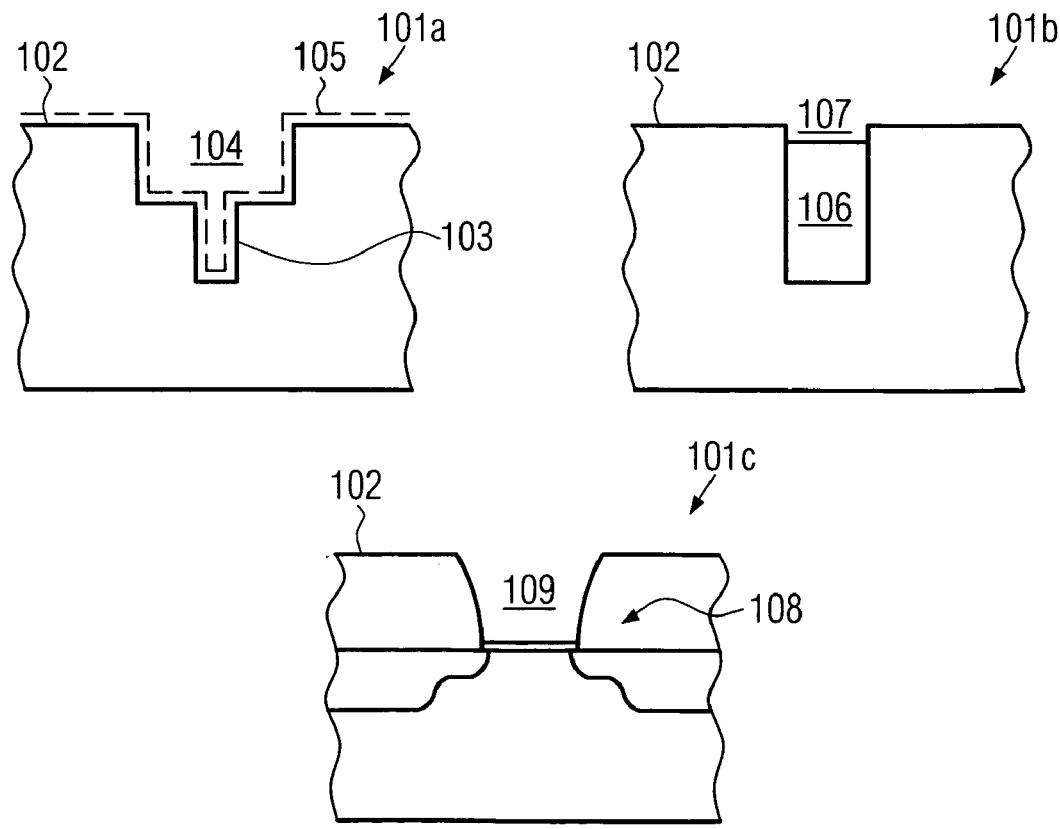
FIG. 1b schematically illustrates cross-sectional views of a substrate and a substrate surface having specified topographies for receiving a metal thereon.

FIG. 1*b* schematically illustrates cross-sectional views of the substrate 101, wherein the substrate surface 102 includes a specified topography, representing certain structural features, such as circuit elements of integrated circuits. In FIG. 1*b*, a first portion 101*a* of the substrate 101 comprises, within the respective substrate surface 102, a trench 104 and a via 103, the sidewalls and bottom areas of which are to be coated with a metal, for instance with copper or a copper alloy. In some embodiments, the respective sidewalls and bottom areas of the trench 104 and the via 103 may already be covered by a barrier layer 105, which in some cases may include a catalyst material for initiating the subsequent electroless plating process. The barrier layer 105 may have been formed by appropriate deposition techniques, such as sputter deposition, chemical vapor deposition (CVD), or atomic layer deposition (ALD), whereas, in some illustrative embodiments, the barrier layer 105 may itself be formed by electroless deposition by means of the system 100, wherein the storage tank 120 comprises an appropriate plating solution 121 for achieving the desired material composition of the barrier layer 105. In some embodiments, the trench 104 and the via 103 may represent a portion of the metallization layer of an advanced integrated circuit that requires highly conductive metal lines and metal-filled vias, for instance on the basis of copper and copper alloys, wherein lateral dimensions of, for instance, the via 103 may be 100 nm and even less in highly sophisticated applications.

FIG. 1*b* schematically illustrates a further portion 101*b* of the substrate 101, in which the substrate surface 102 comprises a metal region 106, which may comprise copper or copper alloy, and which is to receive a conductive cap layer within a recess 107. For example, in highly sophisticated applications on the basis of metal lines comprising copper and copper alloys, a barrier layer is typically required to prevent or at least reduce diffusion of copper into surrounding device areas. However, due to the restricted cross-sectional area that may be available for forming the metal region 106, the provision of a non-conductive dielectric barrier layer, especially within the recess 107, may unduly affect the overall conductivity of the metal region 106. Thus, an appropriate capping metal may be deposited by electroless plating using the system 100.

FIG. 1*b* further shows a portion 101*c* of the substrate 101, wherein the substrate surface 102 comprises a transistor structure 108 that is to receive a metal gate within a corresponding opening 109. For instance, in some sophisticated applications with transistor dimensions in the transistor length direction, that is, in FIG. 1*b* essentially the horizontal extension of the opening 109, on the order of magnitude of 50 nm and even less, highly conductive gate electrodes are required, which may be formed after the removal of a dummy gate. Thus, highly efficient and controllable electroless plating techniques using the system 100 may offer a promising process technique for forming metal gates, wherein the corresponding metal gate may not have to be entirely formed by electroless plating.

Again referring to FIG. 1*a*, the substrate 101 is received by the heating unit 180, which raises the temperature of the substrate surface 102 up to the operating temperature for the subsequent actual deposition process by any means as previously described or as will be described with reference to FIGS. 1*d*-1*f*. In typical copper-based electroless plating processes, the operating temperature may be in the range of approximately 40-100° C., and in other embodiments approximately 50-90° C. It should be appreciated, however, that depending on the specifics of the plating solution 121, a catalyst material included in the substrate surface 102 and the like, other temperature ranges may be appropriate. As previously explained, in some embodiments, the momentary surface temperature may be monitored by the temperature controller 181 and may be compared with a target value, wherein the target value may represent the operating temperature of the recipe under consideration or a higher temperature to take into account any temperature reduction during the further processing of the substrate 101, when the heating unit 180 is configured to heat up the substrate 101 only prior to the actual deposition process, that is, prior to bringing the plating solution 121 into contact with the substrate surface 102 within the process chamber 140. For instance, the heating unit 180 or a part thereof may be incorporated in any pre-treatment equipment for pre-treating the substrate 101 prior to the actual deposition process. In this case, a certain degree of cooling may take place during transport of the substrate 101 before the surface 102 comes into contact with the plating solution 121. In other embodiments, the heating unit 180 may be configured to heat the substrate surface 102 while it is in contact with the plating solution 121. For example, a substrate holder (not shown) in the process chamber 140 may represent a part of the supply system 160 and may be configured to provide a carrier surface in contact with the substrate that may be controllably heated.

After heating the substrate 101 by the heating unit 180, the substrate 101 is positioned in the process chamber 140 to be prepared for being contacted by the plating solution 121. In FIG. 1a, the heated substrate surface 102 is indicated by a hatched surface to indicate that the surface temperature is at least at the operating temperature or higher. Moreover, depending on the structural configuration of the system 100, and in particular of the process chamber 140, the supply system 160 and the heating unit 180, the positioning of the substrate 101 may include any substrate handling and transportation activities necessary for bringing the substrate surface 102 into contact with the plating solution 121. For this purpose, the supply system 160 may be configured to initiate the actual contact between the plating solution 121 and the substrate surface 102 by moving the substrate 101 and/or supplying a portion of the plating solution 121 on the surface 102. As soon as the substrate 101 is positioned within the process chamber 140 so as to come into contact with the plating solution 121 by a corresponding action of the supply system 160, the contact is initiated, wherein the plating solution 121 supplied to the surface 102 is at a temperature below the targeted operating temperature and is then activated by heat transferred from the heated surface 102 to that portion of the plating solution 121 that is in contact with the surface 102. Consequently, substantial deposition only occurs at areas at which the plating solution 121 is heated to the operating temperature or higher, thereby substantially restricting the actual deposition area to the heated substrate surface 102.

As previously explained, in some embodiments, the heating unit 180 may be configured to heat or maintain the operating temperature of the substrate surface 102 while it is in contact with the plating solution 121. In other embodiments, however, heating of the substrate 101 may be discontinued upon contact with the plating solution 121, which may cause a certain degree of cooling. In these embodiments, the initial temperature of the substrate surface 102 after leaving the heating unit 180 may be adjusted to be sufficiently far above the desired minimum operating temperature so that, even during the entire deposition process, an efficient chemical reaction takes place in order to keep the total process time at a low level. In other embodiments, a non-critical temperature for the plating solution 121 may be determined in advance, wherein this non-critical storage temperature is above room temperature, thereby accelerating the actual deposition process as the temperature difference between the contacting plating solution and the heated substrate surface 102 is reduced, while at the same time the plating solution 121 that is not in contact with the substrate 101 stays below a critical temperature for self-catalyzed spontaneous decomposition of the plating solution 121. For instance, in some embodiments, the control unit 122 may maintain the bath temperature within the storage tank 120 within a range of approximately 40-60° C., depending on the characteristics of the plating solution 121. In other embodiments, the storage temperature of the plating solution 121 is substantially maintained at room temperature, while the supply system 160 comprises heating means (not shown) to preheat the plating solution 121 when supplied to the substrate surface 102 by means of corresponding supply lines and tubings. In these embodiments, which maintain the storage temperature low, it may also be advantageous to hold the temperature of the plating solution upon heating the same immediately prior to contact with the substrate 101 within any supply lines at a non-critical temperature to avoid clogging or at least reduce the probability for spontaneous self-decomposition of the plating solution 121.

FIG. 1c schematically shows the substrate portions 101a, 101b and 101c after the completion of the plating process performed in the system 100 and possibly after additional processes for completing the metal deposition or removing any excess material and/or planarizing the substrate surface 102. Thus, the portion 101a may comprise a seed layer 110, wherein, as previously explained, also the barrier layer 105 may have been formed by electroless deposition, while in the portion 101b, the metal region 106 is capped by a metal cap layer 111, and, in the portion 101c, a metal gate 112 is formed in the transistor structure 108. It should be appreciated that corresponding plating processes by means of the system 100 for the above substrate portions 101a, 101b and 101c may not be performed in a common process and may typically require different process recipes, which are specifically adapted to the fill characteristics required and the feature dimensions involved. It should further be noted that forming the metal gate 112 may also be accomplished by a combination of electroless plating and electroplating, wherein first a barrier layer and/or a seed layer may be deposited, similarly to the process for the substrate portion 101a, wherein subsequently the metal gate 112 is completed by electroplating deposition.

FIG. 1d schematically shows a system 100 in accordance with further illustrative embodiments. In these embodiments, at least a portion of the heating unit 180 (FIG. 1a) is incorporated in the process chamber 140 and may be represented by a temperature-controlled substrate holder 182. Moreover, a portion of the supply system 160 may be represented by any appropriate supply lines (not shown) or by a drive assembly 161 that is configured to bring the substrate holder 182 into the vicinity of the liquid surface 123 and to withdraw the substrate holder 182, when the storage tank 120 and the process chamber 140 represent a bath-type configuration. The substrate holder 182, representing a portion of the heating unit 180, is configured to provide a temperature T2 that is at or above a desired targeted operating temperature, wherein advantageously the plating solution in the storage tank 120 is maintained at a lower temperature T1 representing a non-critical temperature with respect to self-catalyzed decomposition. Furthermore, controlling the temperature T2 of the substrate holder 182 may be performed in accordance with any desired temperature profile, thereby providing significant advantages over conventional solutions, in which the temperature of the plating solution 121 is maintained at the operating temperature. For instance, the temperature T2, which is correlated to the actual temperature of the substrate surface 102, may be kept constant during the entire deposition phase, or the temperature T2 and thus the resulting surface temperature may be varied so as to control the deposition process. To this end, appropriate temperature profiles may be established which may correspondingly affect the reaction rate, wherein the temperature T2 is always maintained above the predefined operating temperature. For example, when a reduced deposition rate is desired at an initial phase of the deposition process, the temperature T2 may be adjusted to the operating temperature and may then be increased so as to also increase the deposition rate. Similarly, the deposition rate may be slowed down, if desired, by correspondingly reducing the temperature T2. Thus, the term "operating temperature" used herein refers to a minimum temperature or refers to the progression of the temperature over deposition time. Hence, a target operating temperature may describe a target temperature progression or a lowest predefined temperature which may not be fallen short of.

Figure 1E:
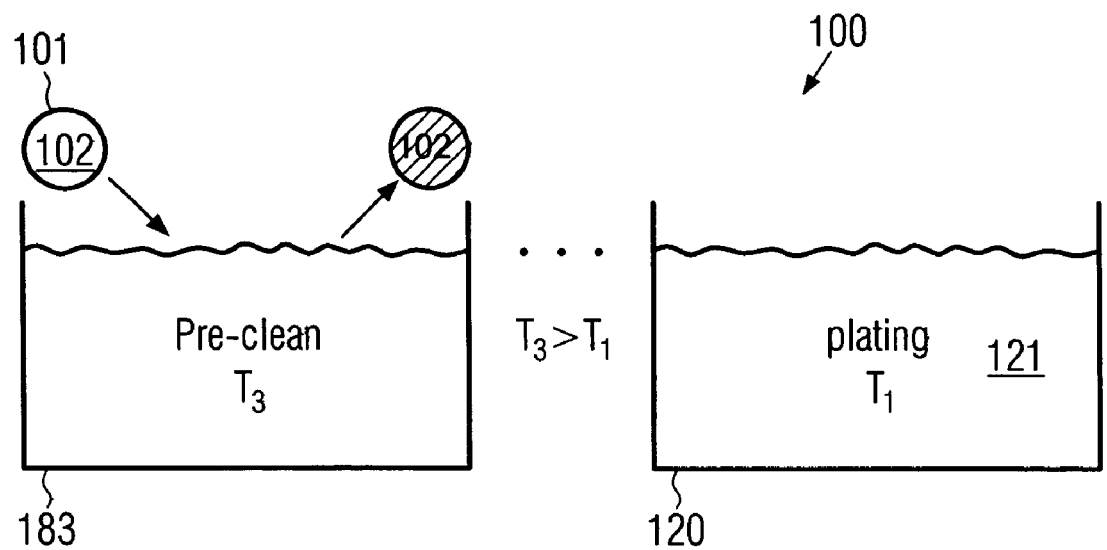
FIGS. 1e and 1f schematically show parts of a heating unit for raising the temperature of the substrate prior to bringing the substrate into contact with the electroless plating solution in accordance with further illustrative embodiments of the present invention.

FIG. 1e schematically shows the system 100 in accordance with further illustrative embodiments. In these embodiments, the heating unit 180 may comprise, in addition or alternatively to the substrate holder 182 (FIG. 1d), a pre-treatment tool, which in the embodiment shown is represented by a pre-clean tool 183. The pre-clean tool 183 may comprise any appropriate heating means (not shown) to raise the temperature of the substrate 101 to a desired temperature T3, which may be equal to or higher than the predefined operating temperature, when the heating unit 180 comprises no further heating elements. In other embodiments, the pre-clean tool 183 may act as a pre-heating unit and the temperature T3 may even be below the operating temperature but higher than the temperature T1 of the plating solution in the storage tank 120. In one embodiment, the pre-clean station 183 may represent a rinse station or rinse bath, in which the rinsing fluid, such as deionized water, may be provided with the temperature T3 to raise the temperature of the substrate surface 102 upon contacting the rinsing fluid. Depending on processes preceding the treatment of the substrate 101 in the pre-clean station 183, other cleaning schemes may be employed, wherein the treatment period within the pre-clean station 183 may be advantageously utilized for raising the temperature of the substrate 101 substantially without "consuming" additional process time.

Figure 1F:
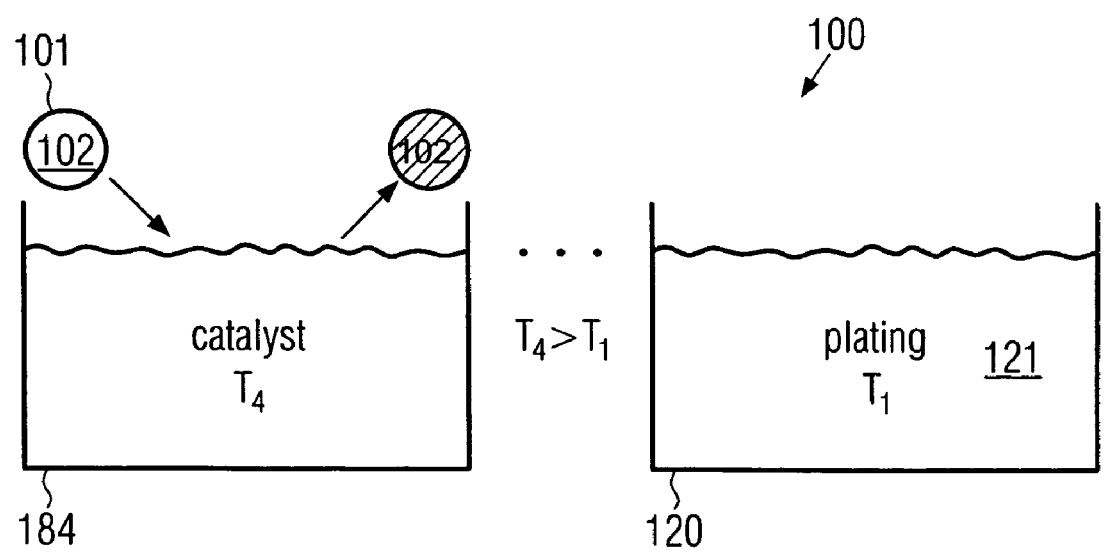

FIG. 1*f* schematically shows the system 100 in accordance with another illustrative embodiment, wherein the heating unit 180 (FIG. 1*a*), in addition or alternatively to the pre-clean station 183 (FIG. 1*e*) and the substrate holder 182 (FIG. 1*d*), comprises a pre-treatment station 184, which may be configured to deposit a catalyst material onto the substrate surface 102, wherein the pre-treatment station 184 is adapted to provide the catalyst material at an elevated temperature compared to conventional tools. For instance, the catalyst material may be supplied by a catalyst bath, wherein the bath temperature T4 is at least the desired operating temperature when downstream of the pre-treatment station 184 no further heating elements and mechanisms are provided. For instance, conventional catalyst materials, such as copper, platinum, palladium, cobalt and the like, used for the initiation of a copper deposition may be provided in the form of appropriate solutions with temperatures up to 50° C., thereby bringing the substrate surface 102 to the operating temperature, when the operating temperature is 50° C. or less. However, for other catalyst materials, higher temperatures may be achieved. Thus, as with the pre-clean station 183, also in the pre-treatment station 184 advantage may be taken of the necessary treatment duration within the station 184 so as to heat the substrate 101 to the desired operating temperature or at least to preheat the substrate 101, when the desired operating temperature is higher than the temperature T4 achieved by the pre-treatment station 184. It should be noted that the embodiments shown in FIGS. 1*e* and 1*f* may advantageously be combined, since typically a wet chemical application of the catalyst material in the pre-treatment station 184 usually requires a corresponding cleaning or rinsing process, which may effectively be performed with the station 183, thereby providing the possibility of effectively heating the substrate 101 in at least one of these stations, and in some embodiments in both of these stations, when moderately high operating temperatures are required, which may exceed the temperature T4 used in the pre-treatment station 184. Furthermore, one or more of the embodiments illustrated with reference to FIGS. 1*e* and 1*f* may be combined with the embodiments described with reference to FIG. 1*d*, thereby ensuring a high throughput of the system 100, as substantially no extra time has to be spent on heating the substrate 101 to or above the predefined operating temperature, while in the final heating phase, the substrate holder 182 (FIG. 1*d*) provides a high degree of process flexibility, since the temperature profile during the actual deposition process may be adapted in accordance with specified process requirements.

As a result, the present invention provides an improved technique for depositing a metal on a substrate surface, in which the desired operating temperature of the electroless plating solution is achieved by maintaining the substrate surface at or above the operating temperature, while the plating solution may be maintained at a non-critical temperature. As a consequence, only the area near the substrate is maintained at the operating temperature while the remaining plating solution, as well as other equipment portions, stay at a temperature significantly below the self-catalyzing limit. Therefore, the probability for self-catalyzing the plating solution is significantly reduced, thereby providing a substantially infinite bath life time of the plating solution and significantly relaxed constraints with respect to process control of the plating system. In addition, chemistry consumption in typical semiconductor fabrication processes as well as the amount of toxic waste may significantly be reduced.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   heating a substrate surface at least to an operating temperature of an electroless metal plating solution; and
   contacting said substrate surface with said electroless metal plating solution to deposit a metal thereon, wherein a temperature of said substrate surface is at or above the operating temperature of the electroless metal plating solution when said substrate surface contacts said electroless metal plating solution,
   wherein heating said substrate surface comprises heating said substrate surface during at least one pre-treatment process preceding the process of contacting said substrate surface with said electroless plating solution.

2. The method of claim 1, wherein a temperature of said electroless metal plating solution immediately prior to contacting said substrate surface is less than said operating temperature.

3. The method of claim 1, wherein said at least one pre-treatment process comprises a catalyst deposition process for applying a catalyst material on said substrate surface.

4. The method of claim 3, wherein heating said substrate surface is performed by providing said catalyst material at a specified elevated temperature.

5. The method of claim 1, wherein said at least one pre-treatment process comprises a catalyst deposition process for applying a catalyst material on said substrate surface and a heating process for heating said substrate surface prior to applying said catalyst material thereon.

6. The method of claim 1, wherein said at least one pre-treatment process comprises a cleaning process in which at least one of the substrate surface and a cleaning agent is heated.

7. The method of claim 1, further comprising determining a temperature representing a surface temperature of said substrate surface and controlling heating of said substrate surface on the basis of the surface temperature.

8. The method of claim 1, further comprising determining a safe storage temperature for said electroless plating solution that is higher than room temperature and maintaining said electroless plating solution at said safe storage temperature while applying a portion thereof on said substrate surface.

9. The method of claim 8, further comprising determining said operational temperature so as to obtain in combination with said safe storage temperature a deposition rate within a predefined range.

10. The method of claim 1, wherein said electroless metal plating solution comprises a metal carrier including a metal that acts as a seed material for a subsequent electrochemical deposition process.

11. The method of claim 1, wherein said electroless metal plating solution comprises a metal carrier including a metal that acts as at least one of a diffusion blocking material and an adhesion material for a metallization metal to be deposited subsequent to depositing said metal.

12. The method of claim 1, wherein said electroless metal plating solution comprises a metal carrier including a metal that acts as a gate electrode material.

13. The method of claim 2, wherein heating said substrate surface is performed after bringing said electroless metal plating solution into contact with said substrate surface.

14. The method of claim 1, wherein said substrate surface comprises a topography including trenches and vias with lateral dimensions of approximately 100 nm and less.

15. The method of claim 1, wherein contacting said substrate surface with said electroless metal plating solution raises a temperature of a portion of said electroless metal plating solution adjacent said substrate surface to at least the operating temperature of said electroless metal plating solution.

* * * * *